(12) United States Patent
Trindade et al.

(10) Patent No.: US 12,237,443 B2
(45) Date of Patent: Feb. 25, 2025

(54) PRINTED COMPONENTS IN DEVICE POCKETS

(71) Applicant: X-Celeprint Limited, Dublin (IE)

(72) Inventors: António José Marques Trindade, Cork (IE); Alexandre Chikhaoui, Kehl (DE); Ronald S. Cok, Rochester, NY (US); Robert R. Rotzoll, Colorado Springs, CO (US); Raja Fazan Gul, Cork (IE); Lei Liu, Cork (IE)

(73) Assignee: X-Celeprint Limited, Dublin (IE)

( * ) Notice: Subject to any disclaimer, the term of this patent is extended or adjusted under 35 U.S.C. 154(b) by 393 days.

(21) Appl. No.: 17/672,396

(22) Filed: Feb. 15, 2022

(65) Prior Publication Data

US 2023/0261149 A1 Aug. 17, 2023

(51) Int. Cl.
*H01L 33/48* (2010.01)
*H01L 25/075* (2006.01)

(52) U.S. Cl.
CPC ........ *H01L 33/483* (2013.01); *H01L 25/0753* (2013.01); *H01L 2933/0033* (2013.01)

(58) Field of Classification Search
CPC ............... H01L 33/483; H01L 25/0753; H01L 2933/0033
USPC .......................................................... 257/99
See application file for complete search history.

(56) References Cited

U.S. PATENT DOCUMENTS

| | | | |
|---|---|---|---|
| 7,622,367 B1 | 11/2009 | Nuzzo et al. | |
| 7,943,491 B2 | 5/2011 | Nuzzo et al. | |
| 8,506,867 B2 | 8/2013 | Menard | |
| 8,722,458 B2 | 5/2014 | Rogers et al. | |
| 8,889,485 B2 | 11/2014 | Bower | |
| 9,520,537 B2 | 12/2016 | Bower et al. | |
| 10,008,483 B2 | 6/2018 | Cok et al. | |
| 10,037,985 B2 | 7/2018 | De Winter et al. | |
| 10,103,069 B2 | 10/2018 | Bower et al. | |
| 10,153,256 B2 | 12/2018 | Cok et al. | |
| 10,200,013 B2 | 2/2019 | Bower et al. | |
| 10,224,460 B2 | 3/2019 | Bower et al. | |
| 10,332,868 B2 | 6/2019 | Cok et al. | |
| 10,468,363 B2 | 11/2019 | Prevatte et al. | |

(Continued)

FOREIGN PATENT DOCUMENTS

| | | | | |
|---|---|---|---|---|
| CN | 113488572 A | * | 10/2021 | |
| KR | 20180020239 A | * | 2/2018 | ........... H01L 33/483 |
| WO | WO-2021137388 A1 | * | 7/2021 | ........... H01L 25/167 |

OTHER PUBLICATIONS

Cok, R. S. et al., Inorganic light-emitting diode displays using micro-transfer printing, Journal of the SID, 25(10):589-609, (2017).

*Primary Examiner* — Phuc T Dang
(74) *Attorney, Agent, or Firm* — Choate, Hall & Stewart LLP; Michael D. Schmitt

(57) ABSTRACT

A micro-device structure includes an insulating layer and a micro-device disposed on the insulating layer. A pocket is formed in the micro-device that extends from a surface of the micro-device opposite the insulating layer through the micro-device to the insulating layer. A micro-component is disposed in the pocket and is non-native to the micro-device and the insulating layer. The micro-component can emit or receive light through the insulating layer and can be connected to and controlled by a micro-circuit disposed in the micro-device.

25 Claims, 15 Drawing Sheets

(56) References Cited

U.S. PATENT DOCUMENTS

| | | | |
|---|---|---|---|
| 10,714,374 B1 | 7/2020 | Cok et al. | |
| 10,937,679 B2 | 3/2021 | Cok et al. | |
| 11,230,471 B2 | 1/2022 | Cok | |
| 2005/0275018 A1* | 12/2005 | Venkatesan | H01L 27/1203 |
| | | | 257/E21.633 |
| 2016/0093600 A1 | 3/2016 | Bower et al. | |
| 2016/0380158 A1 | 12/2016 | Sasaki et al. | |
| 2020/0052164 A1* | 2/2020 | Raymond | H01L 25/13 |
| 2022/0190193 A1* | 6/2022 | Hong | H01L 33/005 |
| 2023/0045741 A1 | 2/2023 | Oh et al. | |

* cited by examiner

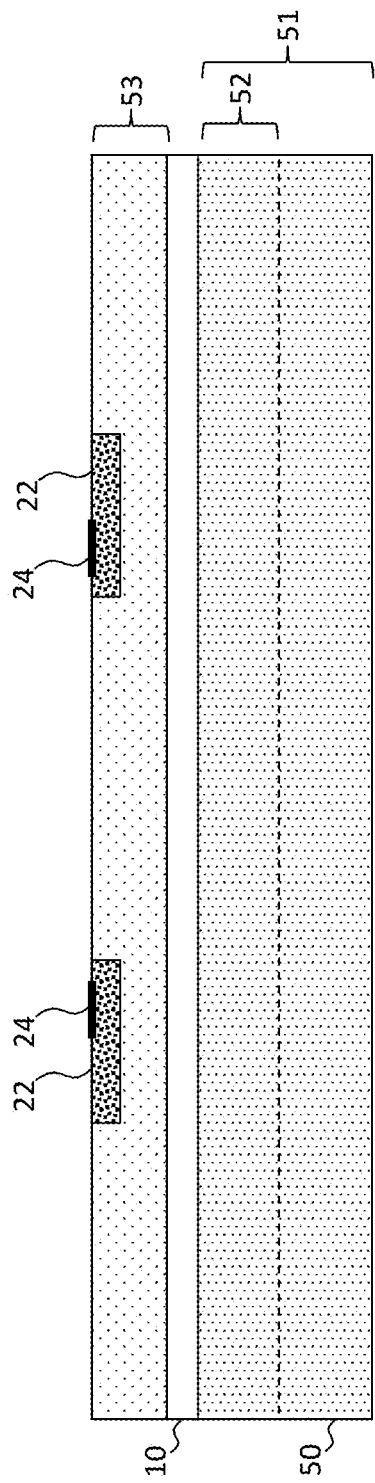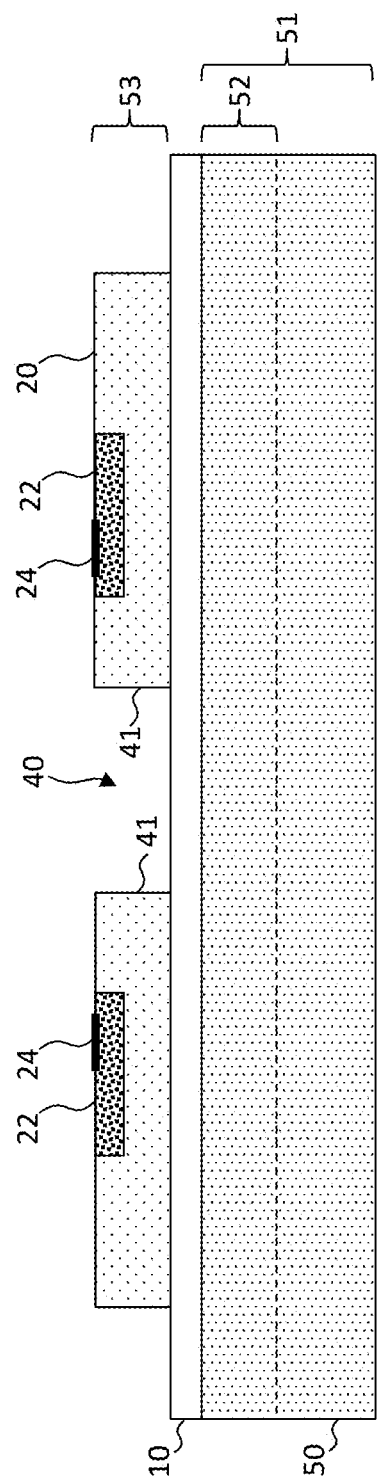

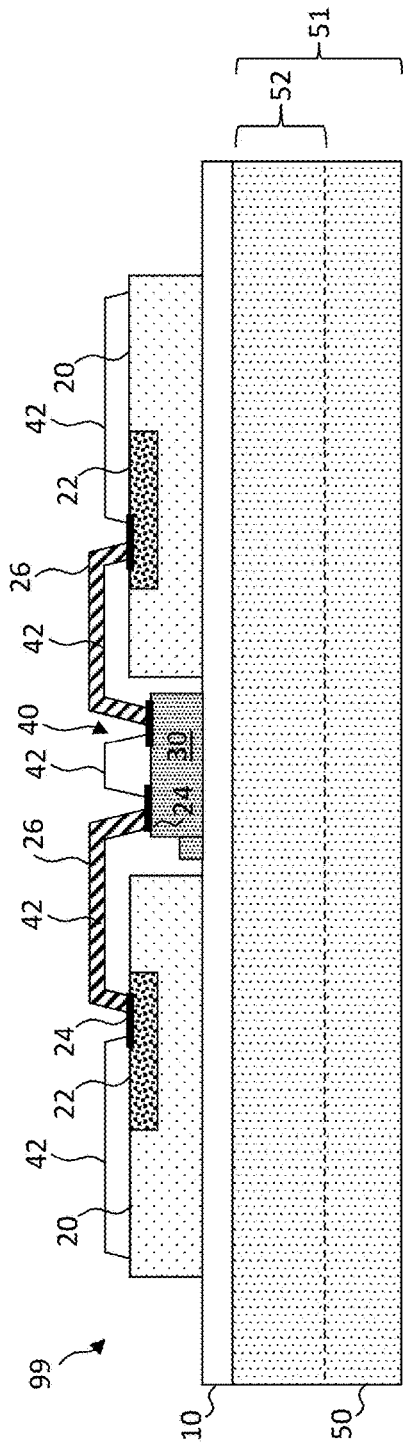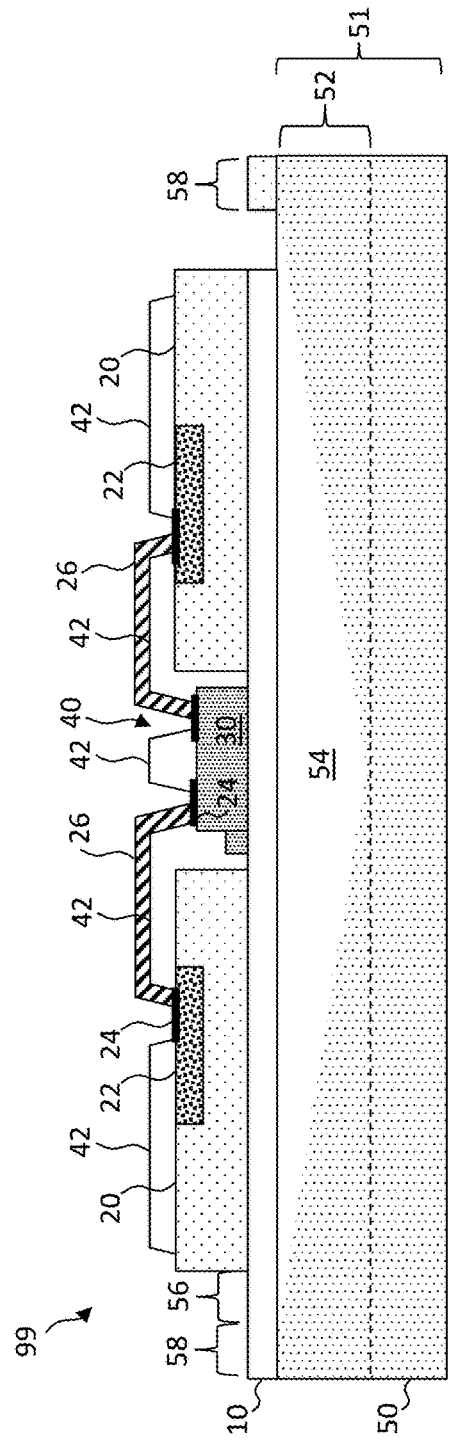

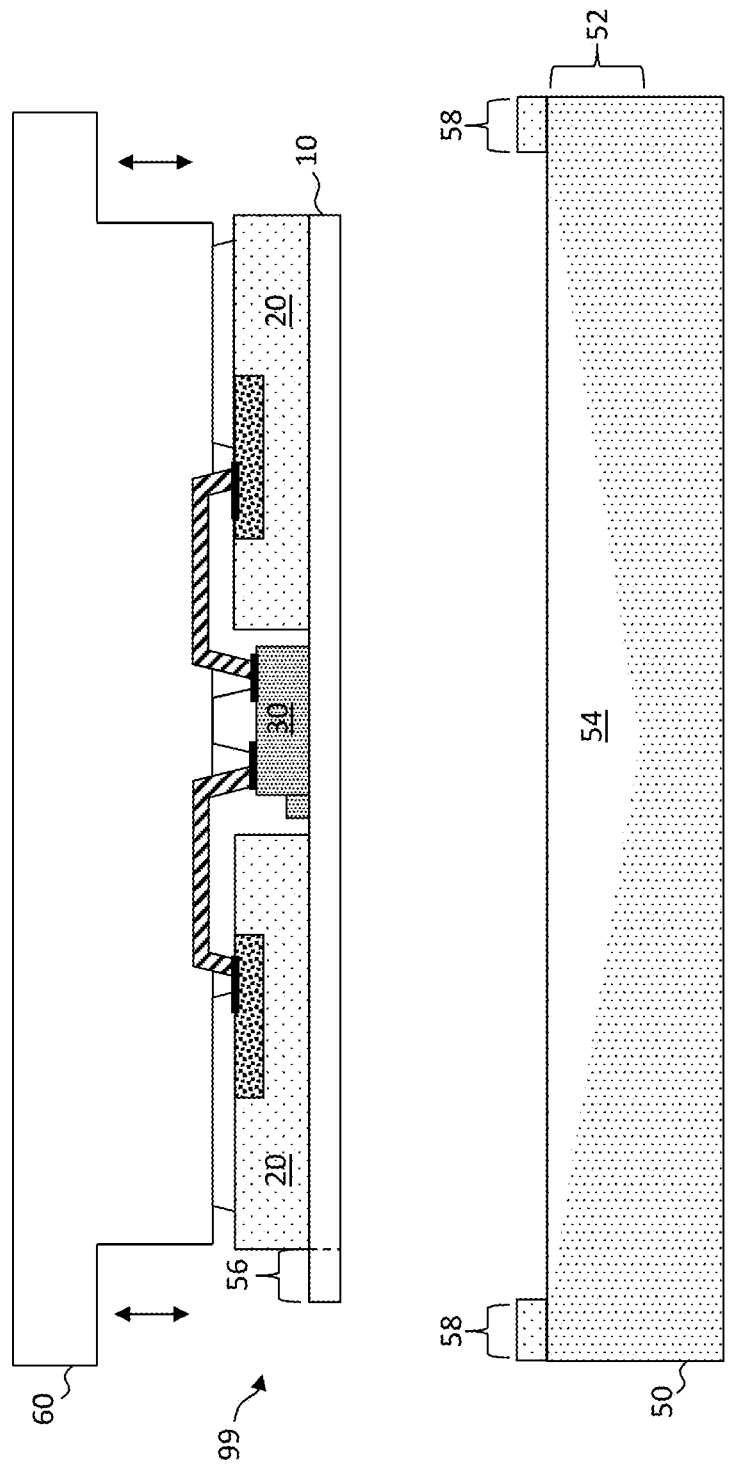

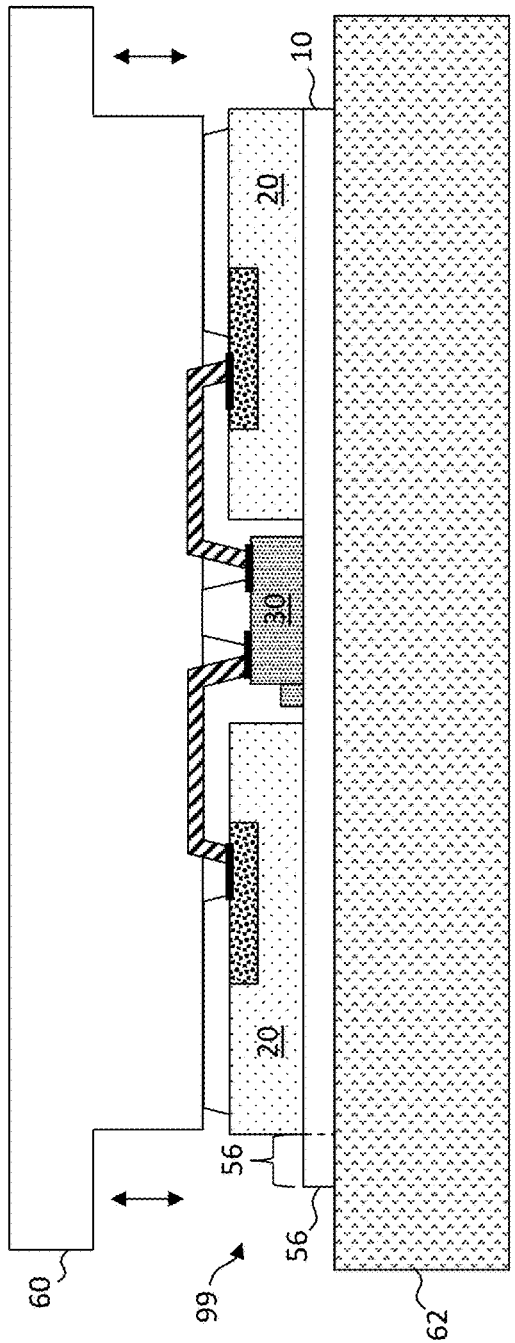
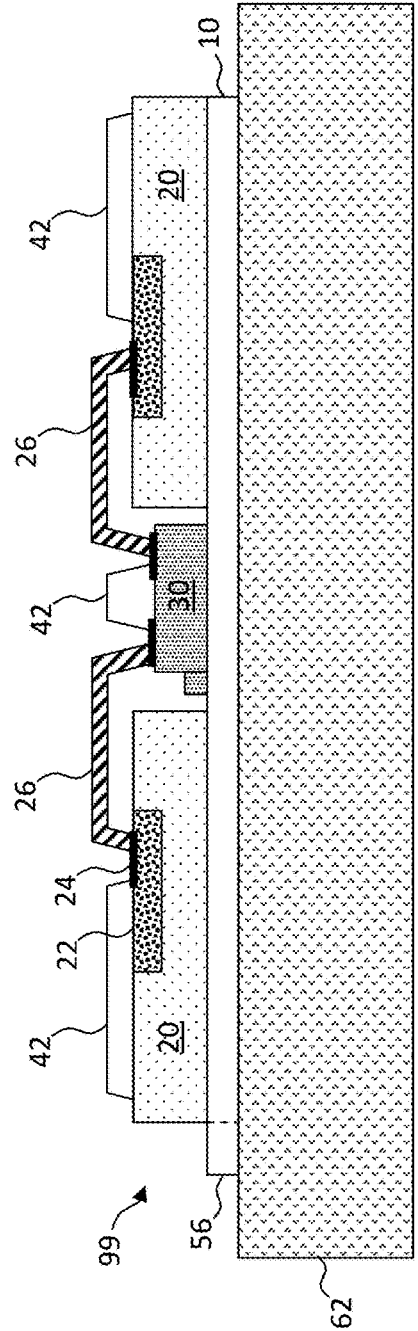

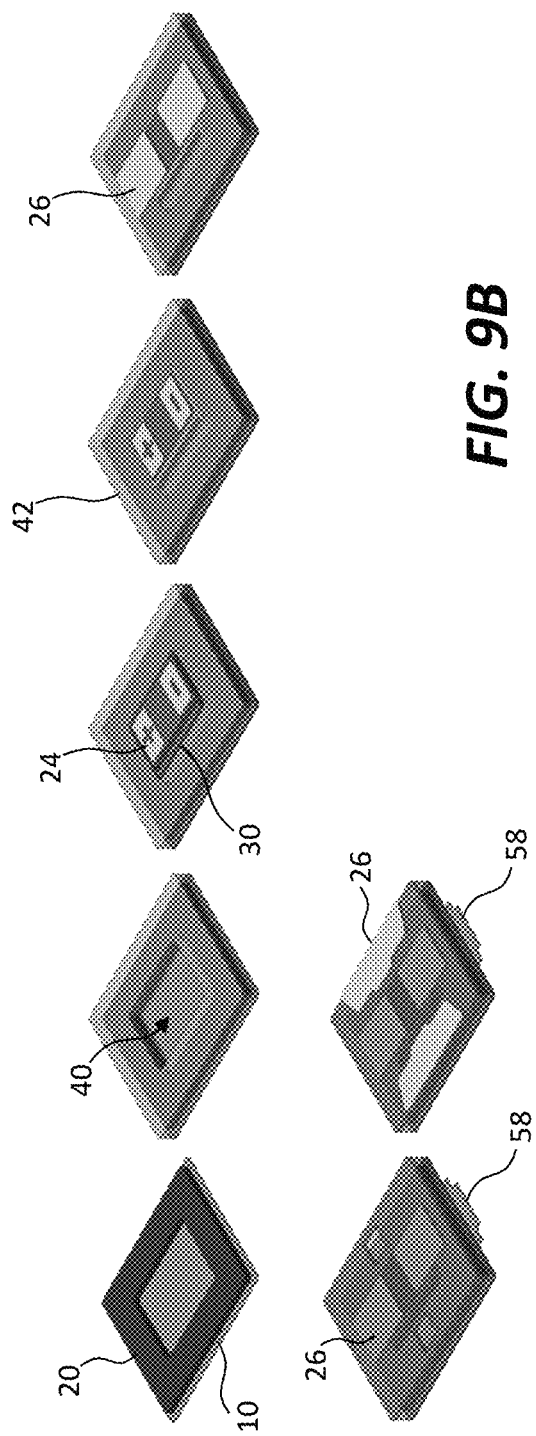

PRINTED COMPONENTS IN DEVICE POCKETS

TECHNICAL FIELD

The present disclosure relates generally to printed or printable structures and methods including micro-assembled devices and components.

BACKGROUND

Substrates with electronically active components distributed over the extent of the substrate are used in a variety of electronic systems. The electronically active components are typically either assembled on the substrate, for example using individually packaged surface-mount integrated-circuit devices and pick-and-place tools, or by sputtering or spin coating a layer of semiconductor material on the substrate and then photolithographically processing the semiconductor material to form thin-film circuits on the substrate. Individually packaged integrated-circuit devices typically have smaller transistors with higher performance than thin-film circuits but the packages can be larger than desired for highly integrated systems.

Other methods for transferring active components from one substrate to another are described in U.S. Pat. No. 7,943,491. In an example of these approaches, small integrated circuits are formed on a native semiconductor source wafer. The small unpackaged integrated circuits, or chiplets, are released from the native source wafer by etching a layer formed beneath the circuits. A viscoelastic stamp is pressed against the native source wafer and the process side of the chiplets is adhered to individual stamp posts. The chiplets on the stamp are then pressed against a destination substrate or backplane with the stamp and adhered to the destination substrate. In another example, U.S. Pat. No. 8,722,458 entitled Optical Systems Fabricated by Printing-Based Assembly, teaches transferring light-emitting, light-sensing, or light-collecting semiconductor elements from a wafer substrate to a destination substrate or backplane.

Micro-transfer-printed systems can comprise multiple components micro-transfer-printed from different source wafers comprising different semiconductor materials onto a common substrate. Each component semiconductor material can be selected to provide the desired component attributes and performance. For example, compound semiconductor micro-components can be combined with and electrically connected to silicon micro-components in a common micro-system. U.S. patent application Ser. No. 15/412,881 describes a compound sensor device comprising a silicon substrate and a compound semiconductor sensor disposed directly over an electronic circuit in the silicon substrate. U.S. Pat. No. 10,037,985 discloses a compound power transistor device comprising a power transistor micro-transfer printed on a semiconductor substrate wherein the power transistor and the semiconductor substrate comprise different materials.

Small, micro-assembled systems have a desirably small footprint. There is a need, therefore, for structures and methods for micro-assembling components comprising different materials into useful systems with a small area.

SUMMARY

The present disclosure provides, inter alia, structures, materials, and methods for micro-assembling micro-components and micro-devices into a micro-device structure or micro-system. The micro-device structure can provide a more densely packed and smaller micro-assembled system.

In some embodiments, a micro-device structure includes an insulating layer and a micro-device disposed on the insulating layer. A pocket is formed in the micro-device that extends from a surface of the micro-device opposite the insulating layer through the micro-device to the insulating layer. A micro-component is disposed in the pocket and is non-native to the micro-device and the insulating layer. In some embodiments, the micro-component can emit or receive light through the insulating layer. In some embodiments, the micro-component can be connected to and controlled or controllable by a micro-circuit disposed in the micro-device.

In some embodiments, the micro-device comprises a micro-device substrate, the micro-component comprises a micro-component substrate, and the micro-component substrate is distinct (e.g., individual, separate, independent) from the micro-component substrate. The micro-device substrate can comprise a different material from the micro-component substrate. The micro-device can be a semiconductor-on-insulator device.

According to some embodiments, the insulating layer is transparent to electromagnetic radiation, for example any one or combination of visible light, infrared radiation, and ultraviolet radiation. A transparent insulating layer can be substantially transparent to wavelengths of interest, for example no less than 50%, 60%, 70%, 80%, 90%, or 95% transparent. The insulating layer can comprise an oxide, a nitride, silicon dioxide, or silicon nitride or a combination of these selected to reduce stress and prevent curl in the insulating layer. The insulating layer can be differentially etchable from the micro-device.

According to some embodiments, the micro-component can be an inorganic LED and the inorganic LED can be disposed on the insulating layer to emit light through the insulating layer. The micro-component can be electrically connected to and controlled by the micro-device. The micro-component can have a length no greater than 50 µm (e.g., no greater than 20 µm, no greater than 10 µm, no greater than 5 µm, or no greater than 2 µm), a width no greater than 50 µm (e.g., no greater than 20 µm, no greater than 10 µm, no greater than 5 µm, or no greater than 2 µm), or a thickness no greater than 20 µm (e.g., no greater than 10 µm, no greater than 5 µm, no greater than 1 µm, or no greater than 1 µm). The micro-device can have a length no greater than 1 mm (e.g., no greater than 750 µm, no greater than 500 µm, no greater than 200 µm, no greater than 100 µm, no greater than 50 µm, or no greater than 20 µm), a width no greater than 1 mm (e.g., no greater than 750 µm, no greater than 500 µm, no greater than 200 µm, no greater than 100 µm, no greater than 50 µm, or no greater than 20 µm), or a thickness no greater than 100 µm (e.g., no greater than 50 µm, no greater than 20 µm, no greater than 10 µm, no greater than 5 µm, no greater than 2 µm, or no greater than 1 µm). The micro-component can have a thickness no greater than a thickness of the micro-device or a thickness that is within 10%, 20%, or 30% of the thickness of the micro-device.

In some embodiments, a micro-device structure comprises a plurality of micro-components disposed in the pocket that are each non-native to the micro-device. The plurality of micro-components disposed in the pocket can comprise (i) one or more red micro-LEDs operable to emit red light disposed in the pocket, (ii) one or more green micro-LEDs operable to emit green light disposed in the pocket, (iii) one or more blue micro-LED operable to emit blue light disposed in the pocket, or (iv) any combination of (i), (ii), and (iii).

The micro-device can comprise a pixel controller electrically connected to the plurality of micro-components and the plurality of micro-components comprises a red micro-LED of the one or more red micro-LEDs, a green micro-LED of the one or more green micro-LEDs, and a blue micro-LED of the one or more blue micro-LEDs and the pixel controller, the red micro-LED, the green micro-LED, and the blue micro-LED are comprised in a pixel.

According to some embodiments, the micro-device completely surrounds the micro-component in a plane parallel to a surface of the insulating layer. According to some embodiments, the micro-device does not completely surround the micro-component in a plane parallel to a surface of the insulating layer. In some embodiments, the micro-device forms at least one side (e.g., two sides or three sides) of the pocket. For example, the micro-device can form a U-shape around the pocket, the micro-device can form three sides of the pocket, the micro-device can form two sides of the pocket, or the micro-device can form one side of the pocket. In some embodiment, the micro-device is disposed on a portion of the insulating layer and the micro-component is disposed on a different portion of the insulating layer. The micro-device can comprise a side-wall forming a side of the pocket (a side of the micro-device) and the micro-component can be in contact with or adhered to the side-wall.

According to embodiments of the present disclosure, a method of making a micro-device structure comprises providing a semiconductor-on-insulator source wafer comprising an epitaxial layer disposed on an insulating layer disposed on a sacrificial layer of a bulk semiconductor layer, forming a pocket in the semiconductor-on-insulator source wafer that extends through the epitaxial layer to the insulating layer, and disposing a micro-component in the pocket to provide the micro-device structure. Methods of the present disclosure can comprise electrically connecting the micro-component to the micro-device.

The semiconductor-on-insulator wafer can comprise a sacrificial layer comprising sacrificial portions spaced apart by anchors. The micro-device structure can be disposed entirely and directly above one of the sacrificial portions and a tether can connect the micro-device structure to one of the anchors. Methods of the present disclosure can comprise etching the sacrificial portions to release the micro-device structure so that the micro-device structure is suspended by the tether over the etched sacrificial portion. Methods of the present disclosure can comprise micro-transfer printing the micro-device structure from the semiconductor-on-insulator source wafer to a target substrate with a transfer device, e.g., a stamp.

According to some embodiments, a micro-device structure comprises a micro-device comprising a pocket formed in the micro-device. The pocket extends through the micro-device and a micro-component is disposed in the pocket. The micro-component is non-native to the micro-device.

Embodiments of the present disclosure provide structures and methods for micro-assembling components comprising different materials into useful systems having a reduced footprint.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 4A-4J are successive illustrations of structures formed by methods according to illustrative embodiments of the present disclosure;

FIG. 9B shows successive structures formed in assembling the layers of FIG. 9A according to illustrative embodiments of the present disclosure.

Figure 1A:
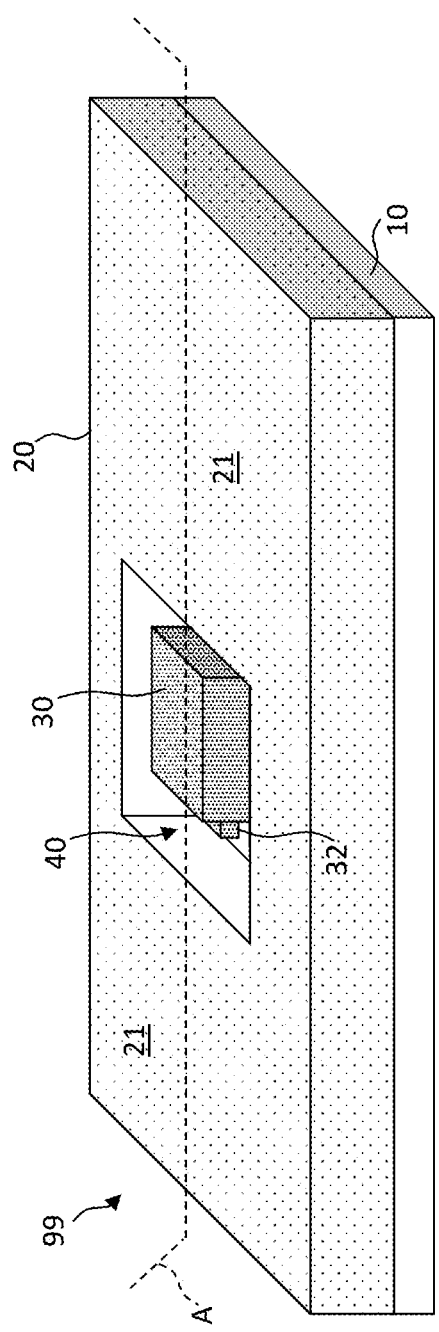
FIG. 1A is a perspective of a micro-device structure comprising a micro-device and a micro-component.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale. The vertical scale of the Figures can be exaggerated to clarify the illustrated structures.

DETAILED DESCRIPTION OF CERTAIN EMBODIMENTS

Electronic circuit performance and size (e.g., component spatial density) are important attributes of electronic systems. However, very small and dense electronic systems (micro-systems) are increasingly difficult and expensive to construct. Some micro-systems comprise micro-assembled micro-components from a variety of sources comprising a variety of materials disposed on a common substrate and electrically, optically, or electro-optically connected using photolithographic methods and materials. Such micro-systems have a desirably small footprint, e.g., a small area over a substrate or a substrate with a small area with densely packed micro-components. Micro-systems with even smaller micro-system areas can be provided by integrating a micro-component within a pocket in a micro-transfer-printed micro-device, e.g., a hole, pit, hollow, chamber, receptacle, or opening that extends through the micro-device. The micro-transfer-printed micro-device is separate from the micro-component and has a substrate distinct (e.g., separate, independent, individual) from the micro-component or a micro-component substrate. One or both of the micro-device and the micro-component can be micro-transfer printed. One or both of the micro-device and the micro-component can comprise a broken (e.g., fractured) or separated tether as a consequence of micro-transfer printing. Micro-transfer-printed micro-devices can be released from a source wafer with an etchant and can, but do not necessarily, comprise a thin etch-resistant insulating (e.g., dielectric) layer, for example ranging in thickness from a few nanometers to a few microns. Micro-components can be micro-transfer printed into a micro-device pocket that exposes the etch-resistant dielectric layer, thus reducing the thickness and area of the micro-system (as compared to stacking micro-component(s) on a micro-device). Micro-assembled micro-device(s) and micro-component(s) can be comprised in a micro-device structure that can be a micro-transfer printable or micro-transfer printed micro-system.

Figure 1B:
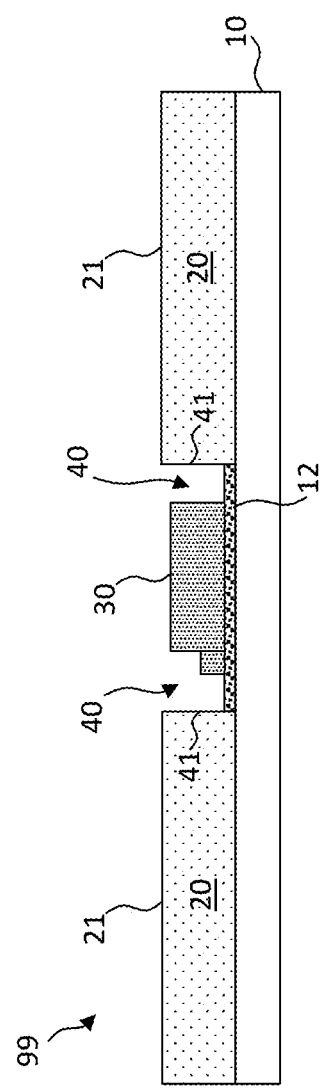
FIG. 1B is a cross section of the micro-device structure taken across cross section line A of FIGS. 1A and 1C.
Figure 1C:
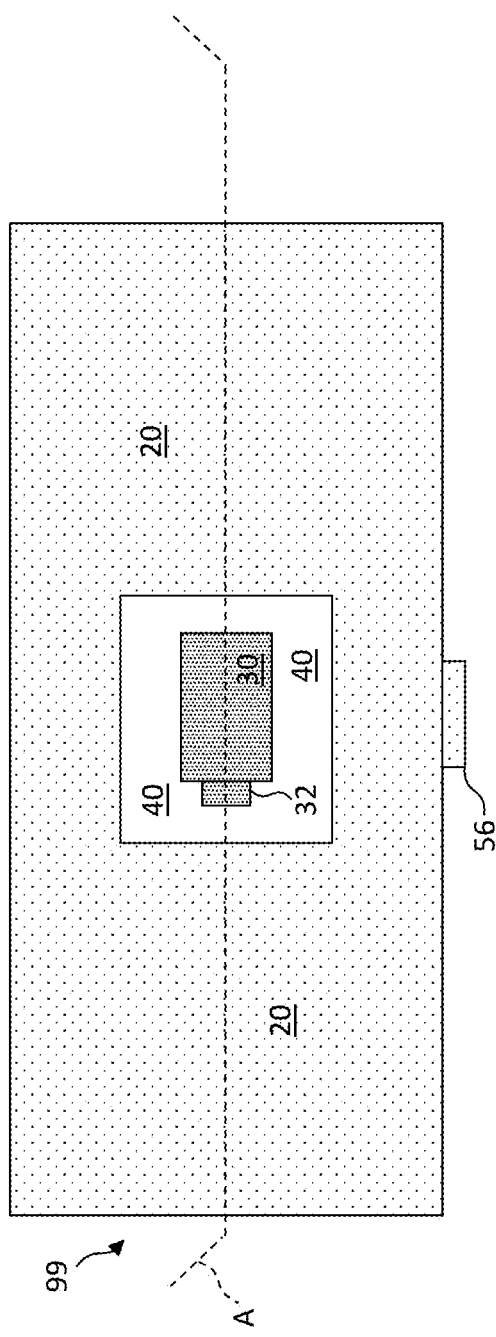
FIG. 1C is a plan view of the micro-device structure of FIG. 1A according to illustrative embodiments of the present disclosure.

According to embodiments of the present disclosure and as illustrated in FIGS. 1A-1C, a micro-device structure 99 comprises an insulating layer 10 and a micro-device 20 disposed on insulating layer 10. Micro-device 20 comprises, has, or includes a pocket 40 formed in micro-device 20 that extends from a micro-device surface 21 (e.g., a side) of micro-device 20 opposite insulating layer 10 through micro-device 20 to insulating layer 10, e.g., extends all of the way through micro-device 20. A micro-component 30 is disposed in pocket 40. Micro-component 30 can be disposed directly on a surface of insulating layer 10 or, as shown in FIG. 1B, on an adhesive layer disposed on insulating layer 10 deposited, for example, with a spin, spray, or slot coater. Adhesive layer 12 can comprise a resin, polymer, or epoxy, for example a cured adhesive 12 (cured after disposing micro-component(s) 30), can be transparent and have similar transparency as insulating layer 10, and can adhere micro-component 30 to insulating layer 10. In any case, either with or without adhesive layer 12, and according to embodiments of the present disclosure, micro-component 30 is disposed on insulating layer 10 in pocket 40. Pocket 40 can be formed by pattern-wise etching micro-device 20 with an etchant that differentially etches material of micro-device 20 and insulating layer 10. Insulating layer can be an etch-stop layer. Pocket 40 can have substantially vertical sides with respect to micro-device surface 21 or can be substantially sloped (e.g., corresponding to an etch plane), depending on a material of micro-device 20 and the etchant.

Micro-component 30 can be non-native to micro-device 20 and/or to insulating layer 10. Micro-component 30 can comprise one or more different materials than micro-device 20. Micro-device 20 can comprise a micro-device substrate, micro-component 30 can comprise a micro-component substrate, and the micro-device substrate can be distinct (e.g., individual, separate, independent) from the micro-component substrate. Micro-device 20 can be native to and constructed on insulating layer 10 (e.g., can be constructed using photolithographic materials and methods in an epitaxial layer deposited on insulating layer 10, for example by evaporation or sputtering). Micro-component 30 can be transferred (e.g., micro-transfer printed) from a component source wafer into pocket 40. Micro-component 30 can comprise a broken (e.g., fractured) or separated micro-component tether 32 as a consequence of micro-transfer printing. Micro-component 30 can comprise a compound semiconductor material such as GaN, GaAs, or InP and micro-device 20 can comprise a semiconductor material such as silicon. Both micro-component and micro-device 20 can comprise a crystalline material such as a crystalline semiconductor material. Micro-device 20 can be or comprise a semiconductor-on-insulator device.

According to some embodiments, insulating layer 10 is transparent, for example substantially transparent or no less than 50%, 60%, 70%, 80%, 90%, or 95% transparent to desired wavelengths of electromagnetic radiation, such as visible light. Insulating layer can comprise an oxide, a nitride, silicon dioxide, silicon nitride, or combinations of layers of different oxides or nitrides, for example to control stress in insulating layer 10. Insulating layer 10 can be differentially etchable from material comprising micro-device 20.

Figure 2:
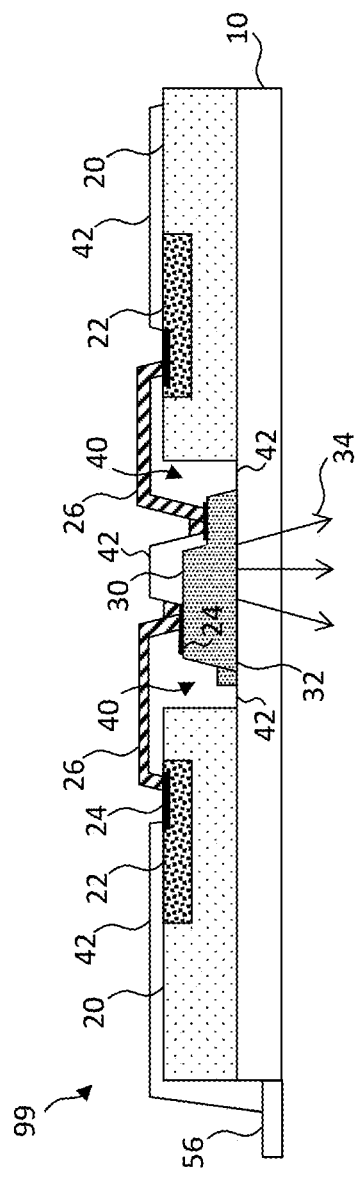
FIG. 2 is a cross section of a micro-device structure comprising a micro-circuit electrically connected to a micro-component according to illustrative embodiments of the present disclosure.

In some embodiments and as shown in FIG. 2, micro-component 30 is an electromagnetic-radiation-emitting or -receiving component, e.g., a light-emitting component such as an inorganic light-emitting diode or laser or a light-receiving component such as a photo-diode. Light 34 can be visible light or include ultraviolet or infrared electromagnetic radiation. The light-emitting or light-receiving micro-component can be disposed on insulating layer 10 in pocket 40 to emit light 34 through insulating layer 10, for example as shown in FIG. 2, or to receive light. Micro-component 30 can be electrically connected to micro-device 20, e.g., through photolithographically defined wires.

In some embodiments, micro-component 30 is controllable by micro-device 20. For example, micro-device 20 can comprise a micro-circuit 22 electrically connected to contact pads 24 of micro-device 20 that are electrically connected to electrodes 26 that are electrically connected to contact pads 24 of micro-component 30. Micro-circuit 22 can be an integrated circuit formed using photolithographic methods and materials. Pocket 40 can be planarized after micro-component 30 is disposed in pocket 40, for example with a dielectric material 42, e.g., an organic material such as benzocyclobutene (BCB) or Intervia™ (from Rohm and Haas) spin, spray, or curtain coated over pocket 40 or an inorganic material such as silicon dioxide or silicon nitride evaporated or sputtered over pocket 40. In any case, dielectric material 42 can be photolithographically defined to open contact pads 24 on micro-circuit 22 or micro-component 30. Electrically conductive material (e.g., metal) can then be deposited and patterned using photolithographic methods and materials to form electrodes 26 (e.g., wires) that electrically connect micro-circuit 22 to micro-component 30. Micro-circuit 22 can at least partially surround (e.g., fully or only partially surround) pocket 40 and therefore micro-component(s) 30. For example, micro-circuit 22 can be formed on one side of pocket 40.

Figure 3:
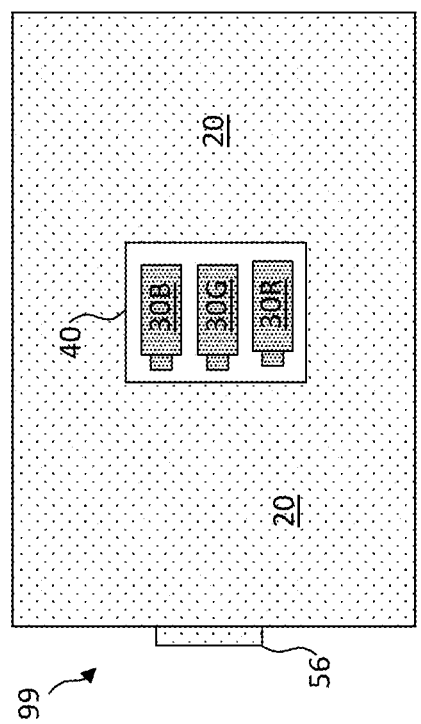
FIG. 3 is a plan view of a micro-device structure comprising a plurality of micro-components in a micro-device pocket according to illustrative embodiments of the present disclosure.

As shown in FIG. 3, and according to some embodiments of the present disclosure, more than one micro-component 30 is disposed in pocket 40 so that micro-device structure 99 comprises a plurality of micro-components 30 disposed in pocket 40 on insulating layer 10 that are non-native to micro-device 20 and non-native to insulating layer 10. Micro-components 30 of the plurality of micro-components 30 can be identical or can be different and some or all can be disposed in pocket 40 by transfer printing, such as micro-transfer printing. Two or more of micro-components 30 in the plurality of micro-components 30 can be electrically connected together in pocket 40. Two or more micro-components in a plurality of micro-components 30 can be electrically connected to micro-circuit 22 of micro-device 20, for example as described with respect to FIG. 2. In some embodiments, micro-components 30 in the plurality of micro-components 30 comprise one or more red micro-LEDs 30R operable to emit red light 34R disposed in pocket 40, one or more green micro-LEDs 30G operable to emit green light 34G disposed in pocket 40, one or more blue micro-LEDs 30B operable to emit blue light 34B disposed in pocket 40, or some combination thereof. Micro-device 20 can be or comprise a pixel controller electrically connected to red micro-LED(s) 30R, green micro-LED(s) 30G, and blue micro-LED(s) 30B and the pixel controller and red micro-LED(s) 30R, green micro-LED(s) 30G, and blue micro-LED(s) 30B can be comprised in a pixel, for example a display pixel or a single pixel that can emit a desired color of light.

Electronic micro-systems of the present disclosure can be constructed using micro-transfer printing. In some embodiments, micro-device system 99, micro-device 20, and micro-component 30 can each (e.g., all) have dimension(s) no greater than 1,000 µm. According to embodiments of the present disclosure, micro-device structure 99 has a length or width, or both, no greater than 1 mm, no greater than 750 µm, no greater than 500 µm, no greater than 200 µm, no greater than 100 µm, no greater than 50 µm, or no greater than 20 µm. Micro-device structure 99 can have a thickness no greater than 50 µm, no greater than 20 µm, or no greater than 10 µm. Micro-device structure 99 can be a micro-transferable with a micro-system tether 56 or a micro-transferred structure with a broken (e.g., fractured) or separate micro-system tether 56, as shown in FIG. 3. (For clarity, micro-system tethers 56 are not shown in FIGS. 1A-2 but can be present).

Similarly and according to embodiments of the present disclosure, micro-device can have one or more of: a length no greater than 1,000 µm (e.g., no greater than 750 µm, no greater than 500 µm, no greater than 200 µm, no greater than 100 µm, no greater than 50 µm, or no greater than 20 µm, or no greater than 10 µm), a width no greater than 1,000 µm (e.g., no greater than 750 µm, no greater than 500 µm, no greater than 200 µm, no greater than 100 µm, no greater than 50 µm, no greater than 20 µm, or no greater than µm), and a thickness no greater than 100 µm (e.g., no greater than 50 µm, no greater than 20 µm, no greater than 10 µm, or no greater than 5 µm).

In some embodiments, micro-component 30 can have one or more of: a length no greater than 50 µm (e.g., no greater than 20 µm, no greater than 10 µm, no greater than 5 µm, or no greater than 2 µm), a width no greater than 50 µm (e.g., no greater than 20 µm, no greater than 10 µm, no greater than 5 µm, or no greater than 2 µm), and a thickness no greater than 50 µm (e.g., no greater than 20 µm, no greater than 10 µm, no greater than 5 µm, no greater than 1 µm, or no greater than 1 µm).

Micro-device structure 99 can have a length or width, or both, greater than a length or width, or both, of micro-device 20, respectfully. Micro-device 20 can have a length or width (or both a length and a width) greater than a length or width (or both) of micro-component 30, respectfully. Pocket 40 can have a length or width (or both a length and a width) greater than a length or width (or both) of micro-component 30 and smaller than a length or width (or both a length and a width) of micro-device 20, respectfully.

Micro-component 30 can have a thickness no greater than a thickness of micro-device 20 so that micro-component 30 is entirely within pocket 40. Micro-component 30 can have a thickness greater than a thickness of micro-device 20 so that micro-component protrudes from pocket 40 in a direction opposite insulating layer 10. Micro-component can have a thickness substantially equal to or within 10%, 20%, or 30% of a thickness of micro-device 20 so that micro-component 30. Micro-component 30 can have a thickness no more than 30% (e.g., no greater than 20% or no greater than 10%) greater than a thickness micro-device 20.

Figure 4C:
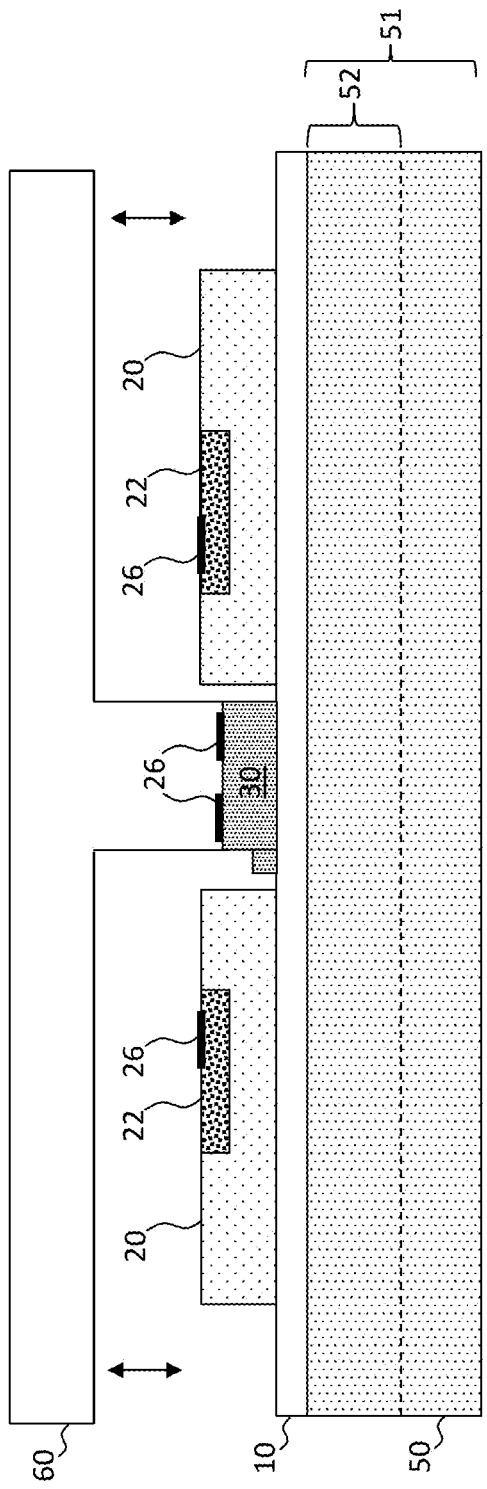
Figure 4D:
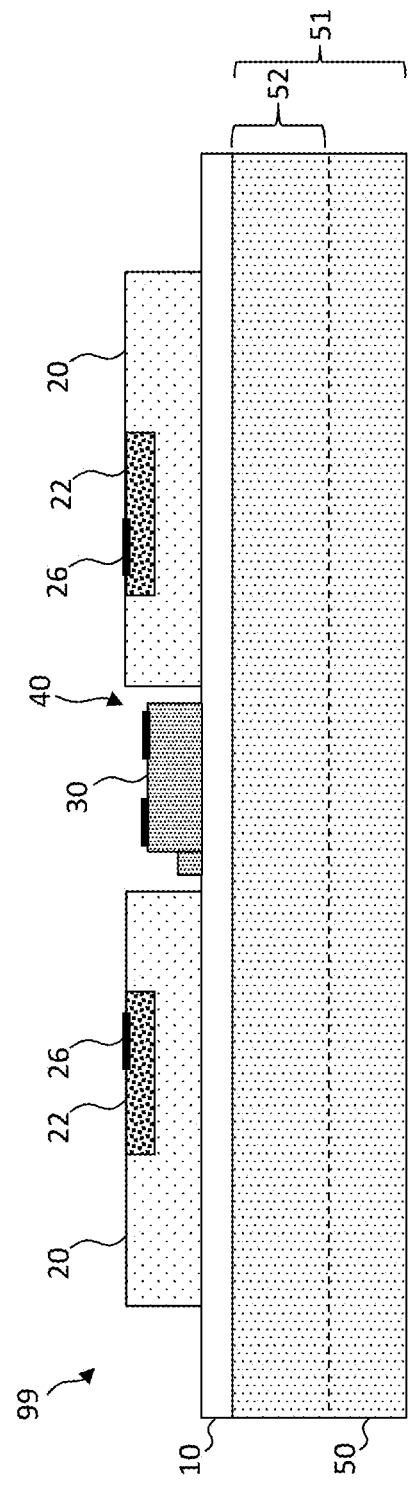
Figure 4G:
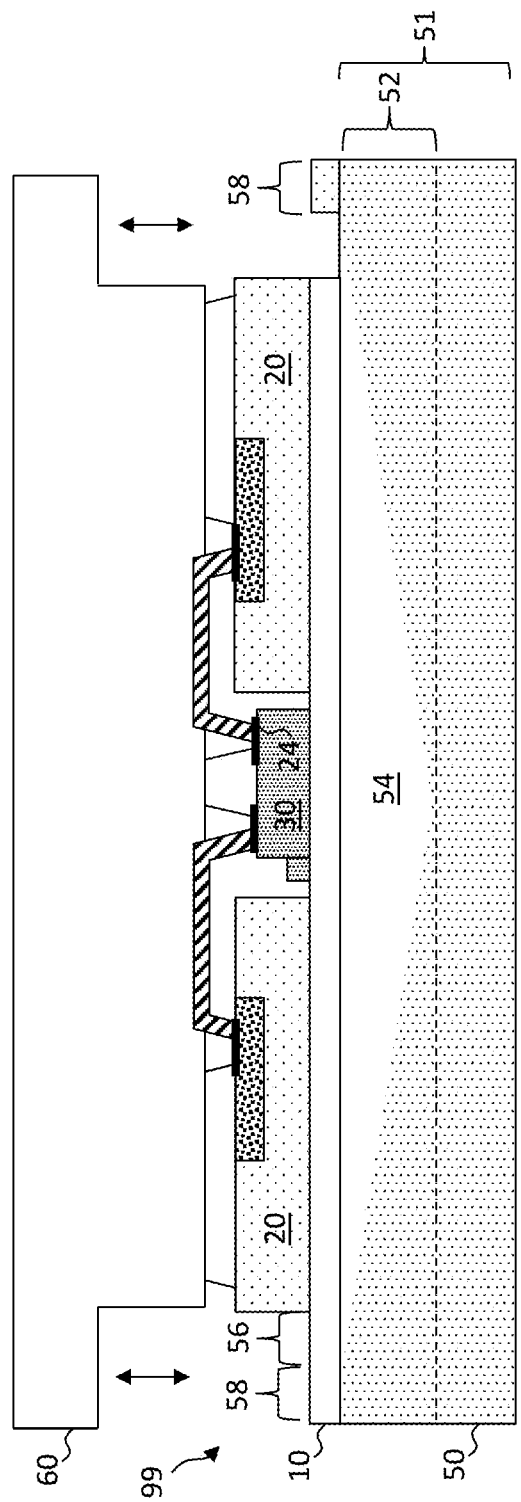
Figure 5:
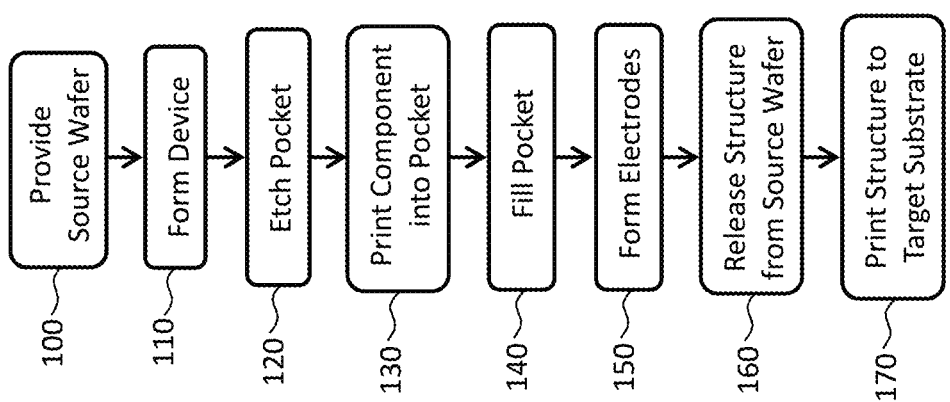
FIG. 5 is a flow diagram of construction methods according to illustrative embodiments of the present disclosure.

FIGS. 4A-4J and FIGS. 9A-9B show successive structures made according to the flow diagram of FIG. 5 illustrating various embodiments of the present disclosure. Experienced practitioners of photolithographic techniques will understand that different processes and materials can be used to construct embodiments of the present disclosure and that claimed embodiments of the present disclosure are not limited to the specific examples presented herein.

As shown in FIG. 5, a source wafer 50, for example a semiconductor-on-insulator (SOI) source wafer 50 comprising an epitaxial layer 53 disposed on an insulating layer 10 disposed on a sacrificial layer 52 of a bulk semiconductor layer 51, is provided in step 100. SOI source wafer 50 can comprise a bulk semiconductor layer 51 a portion of which can be a sacrificial layer 52. An insulating layer 10 is disposed over bulk semiconductor layer 51 and sacrificial layer 52 and an epitaxial layer 53 of semiconductor material disposed over insulating layer 10. Micro-circuits 22 and contact pads 24 can be formed in epitaxial layer 53 in step 110, for example using photolithographic methods and materials, as shown in FIG. 4A for example, and patternwise etched through epitaxial layer 53 to insulating layer 10 in step 120, thereby exposing insulating layer 10 and forming micro-devices 20 and pockets 40, as shown in FIG. 4B for example. In some embodiments, SOI source wafer 50 is provided with exposed insulating layer 10, pockets 40, and micro-devices 20 already formed. In some embodiments, a small residual (e.g., discontinuous) amount of epitaxial layer 53 remains on insulating layer 10 when etching is complete such that when micro-component(s) 30 are disposed in pocket 40 on insulating layer 10, some portion (or all) of the small residual amount of epitaxial layer 53 may be disposed between micro-component(s) 30 and insulating layer 10. In some embodiments an adhesive layer 12 can adhere micro-component 30 to insulating layer 10.

One or more micro-component(s) 30 are disposed in pocket 40, for example by micro-transfer printing with a stamp 60 in step 130, for example as shown in FIG. 4C, to provide micro-device structure 99, as shown in FIG. 4D. Optionally, an adhesive layer 12 (shown in FIG. 1B) is provided in pocket 40 before micro-component(s) 30 are disposed in pocket 40 and cured after micro-component(s) 30 are disposed in pocket 40. Adhesive 12 can be spray- or spin-coated or inkjet printed as a liquid on epitaxial layer 53 and, after curing, exposed adhesive 12 (e.g., not covered by micro-component(s) 30) can be removed if desired, for example by exposure to a plasma. After micro-transfer-printing micro-component(s) 30 into pocket 40, the epitaxial layer 53 and pocket 40 with micro-component(s) 30 can be planarized to fill pocket 40 and provide a processing surface over micro-device 20 in step 140. Electrodes 26 (e.g., wires) electrically connecting micro-component 30 to micro-device 20 (e.g., to micro-circuit 22 and contact pads 24) can be patterned using photolithographic methods and materials (e.g., metal) in step 150 and as shown, for example, in FIG. 4E.

Micro-device system 99 can itself be micro-transfer printed to a target substrate 62. As shown in FIG. 4F, SOI source wafer 50 can comprise a sacrificial layer 52 comprising sacrificial portions 54 spaced apart by anchors 58. Micro-device structures 99 are disposed entirely above a sacrificial portion 54 and a micro-system tether 56 connects micro-device structure 99 to an anchor 58. Sacrificial portions 54 are etched in step 160 to release micro-device system 99 from SOI source wafer 50 so that micro-device structure 99 is suspended by micro-system tether 56 over etched sacrificial portion 54 as shown in FIG. 4G. Micro-device structure 99 can then be micro-transfer printed from SOI source wafer 50 (as shown in FIG. 4H) to a target substrate 62 (as shown in FIG. 4I) with a stamp 60 in step 170, providing a micro-device structure 99 disposed on target substrate 62 as shown in FIG. 4J.

Figure 6A:
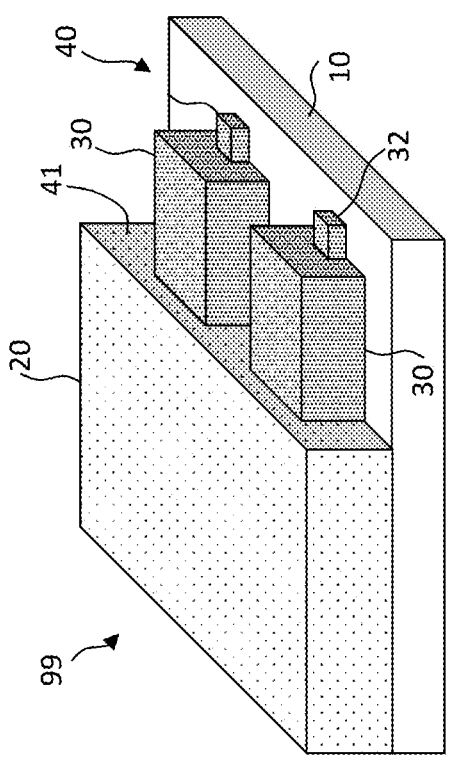
FIG. 6A is a perspective and FIG. 6B is a plan view of a micro-device structure comprising a plurality of micro-components in a micro-device pocket open on three sides according to illustrative embodiments of the present disclosure.
Figure 6B:
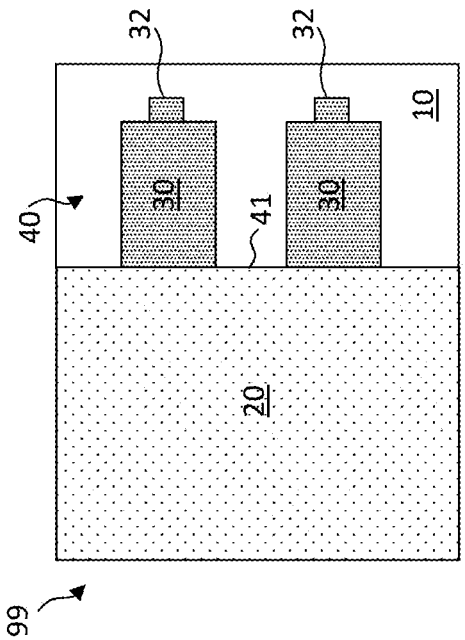
Figure 7A:
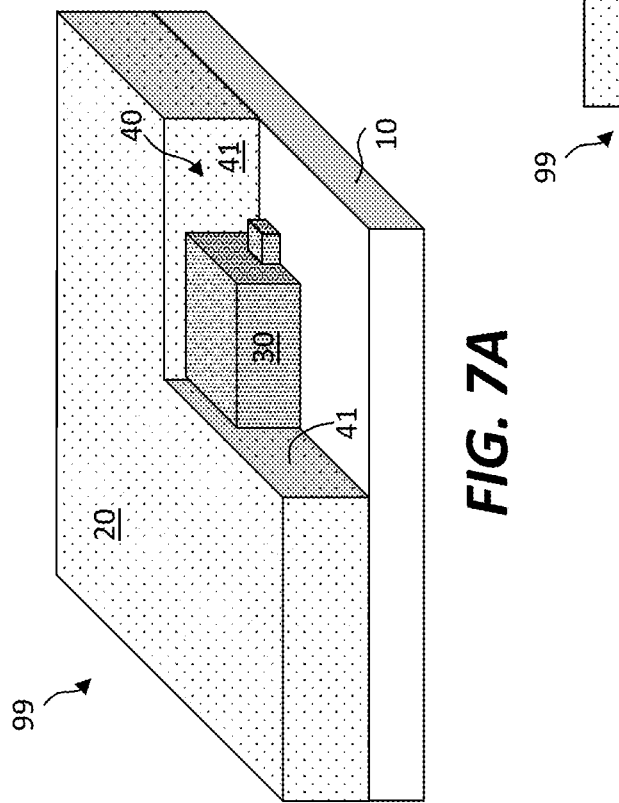
FIG. 7A is a perspective and FIG. 7B is a plan view of a micro-device structure with a micro-device pocket open on two sides according to illustrative embodiments of the present disclosure.
Figure 7B:
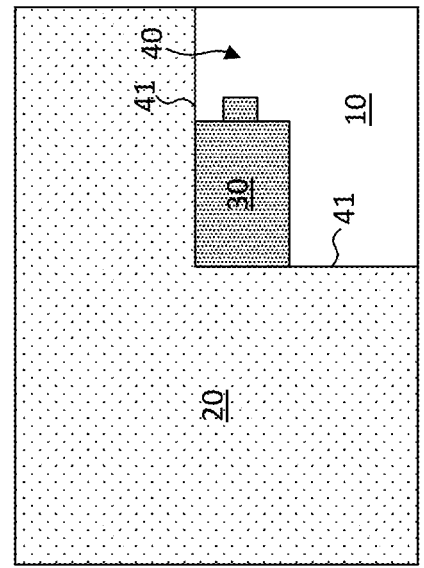
Figure 8A:
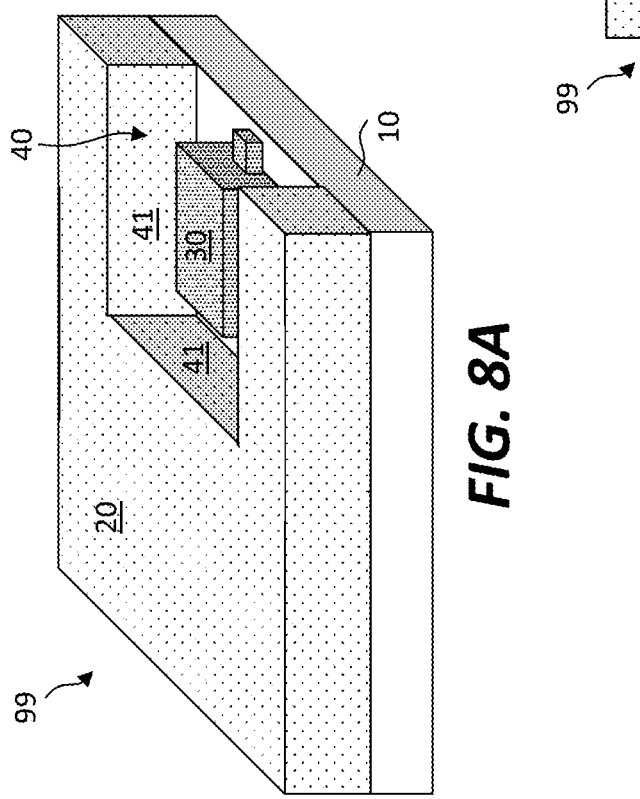
FIG. 8A is a perspective and FIG. 8B is a plan view of a micro-device structure with a micro-device pocket open on one side according to illustrative embodiments of the present disclosure.
Figure 8B:
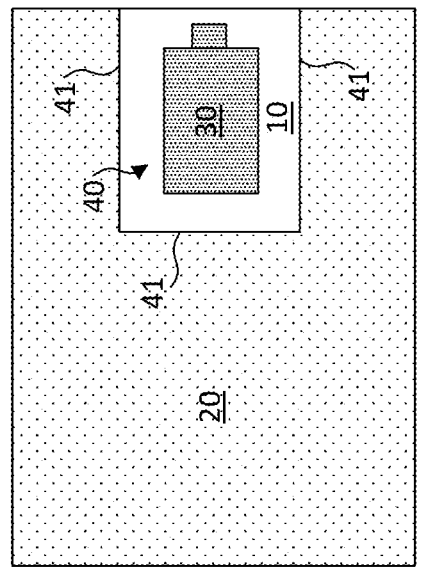
Figure 9A:
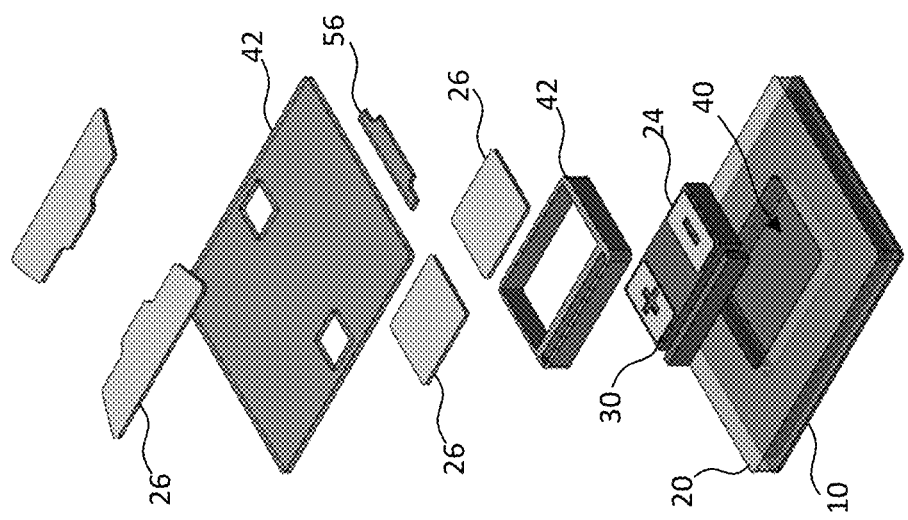
FIG. 9A is an exploded perspective of a micro-device structure according to illustrative embodiments of the present disclosure.

Pocket 40 in epitaxial layer 53 and micro-device 20 can be rectangular or polygonal in horizontal cross section and can have sidewalls 41 extending from micro-device surface 21 to insulating layer 10. In some embodiments, pocket 40 is completely surrounded by micro-device 20, as shown in FIGS. 1A-3, so that micro-device 20 completely surrounds micro-component 30 in a plane parallel to a surface of insulating layer 10 (e.g., the surface on which micro-component 30 is disposed or micro-device surface 21). In some embodiments, pocket 40 is open so that pocket 40 is not completely surrounded by micro-device 20 in a plane parallel to a surface of insulating layer 10, for example because pocket 40 has fewer than four sidewalls 41. The perspective of FIG. 6A and corresponding cross section of FIG. 6B illustrate a pocket 40 in micro-device 20 open on three sides with only one sidewall 41 and two micro-components 30 in pocket 40. Micro-component(s) 30 are adjacent to (e.g., in contact with) the one sidewall 41 of pocket 40 in micro-device 20. The perspective of FIG. 7A and corresponding cross section of FIG. 7B illustrate a pocket 40 in micro-device 20 with two sidewalls 41 and one micro-component 30 in pocket 40. Micro-component 30 is adjacent to (e.g., in contact with) both of the two sidewalls 41 of pocket 40 in micro-device 20. The perspective of FIG. 8A and corresponding cross section of FIG. 8B illustrate a pocket 40 in micro-device with three sidewalls 41 forming a U-shape around pocket 40 and one micro-component 30 in pocket 40. Micro-component 30 can be contacted or adhered to one or more pocket 40 sidewalls 41 using micro-transfer printing. Contacting micro-component to a pocket 40 sidewalls 41 enables a very accurate positioning of micro-component with respect to micro-device 20, for example to facilitate alignment. Accurate alignment can be important for opto-electronic structures such as light-emitters (LEDs, lasers), light-receivers (photodiodes), and light transmitters (fibers). When micro-component(s) 30 are contacted to sidewall(s) 41, micro-component(s) can be finally disposed within 1 μm (e.g., within 500 nm or within 250 nm) of sidewall(s) 41. Pockets that are open on a side can facilitate micro-transfer printing (e.g., by enabling horizontal stamp motion and stamp shear detachment as described in U.S. Pat. Nos. 10,714,374 and 10,937,679, the content of each of which is incorporated by reference herein in its entirety).

Embodiments of the present disclosure can be thinner and have a smaller area than micro-systems using an additional substrate on which micro-devices 20 and micro-components 30 are disposed. Furthermore, embodiments of the present disclosure can be more robust under mechanical and thermal stress since micro-device structure 99 can be more flexible and incorporate fewer and smaller components within a smaller, more flexible structure.

Micro-component 30 can be any structure, circuit, or system useful in combination with micro-device 20, for example an electronic or opto-electronic device such as an active or passive integrated circuit, light-emitting diode, vertical cavity surface emitting laser (VCSEL), photodiode, or sensor. Micro-component 30 can comprise any one or more of a combination of semiconductor, conductive metals, or dielectric materials, such as inorganic oxides (e.g., silicon oxide), nitrides (e.g., silicon nitride), or organic materials such as resins or epoxies. In some embodiments, micro-component 30 can comprise a compound semiconductor, for example GaN, GaAs, InP, or other III/V or II/VI compound semiconductor materials. Micro-component 30 can be constructed using photolithographic methods and materials known in the art. Similarly, micro-device 20 can be any electronic or opto-electronic structure useful in combination with one or more micro-components 30, for example an active or passive electronic or opto-electronic integrated circuit. Micro-device 20 can be a silicon integrated circuit. Micro-device 20 can control, respond to, or interact with micro-component(s) 30.

Bulk semiconductor layer 51 can be constructed using methods known in the semiconductor art, for example using the Czochralski (CZ) method to form a single-crystal wafer, for example a silicon wafer, and can have any useful diameter or thickness, for example industry-standard wafer diameters such as 150, 200, or 300 mm, thickness such as 300-950 microns, or crystal orientation, such as <100>, <110> or <111>, and can have a polished back surface. Insulating layer 10 can be any useful substrate on or in which an epitaxial layer 53 can be disposed and micro-device 20 formed. Insulating layer can be a buried oxide (BOx) layer, for example a thermal oxide layer having a thickness in the range of 0.3 microns to 4 microns, typically 0.5 microns to 2 microns. Insulating layer 10 can be formed on a semiconductor wafer or other wafer, such as sapphire, for example by chemical vapor deposition (CVD) or plasma-enhanced CVD (PECVD). Insulating layer 10 can be or comprise silicon dioxide or silicon nitride, or both, for example to control insulating layer 10 stress. Insulating layer 10 can be differentially etchable, for example using tetramethylammonium hydroxide (TMAH) or potassium hydroxide (KOH), from bulk semiconductor layer 51, epitaxial layer 53, or both. Epitaxial layer 53 can comprise a same material as bulk semiconductor layer 51, can be deposited by CVD or PECVD and, in some embodiments, can have a thickness in the range of 1 micron to 200 microns. Epitaxial layer 53 (and micro-device 20) can be coated with an encapsulating or protective layer to enable bulk semiconductor layer 51 etching without etching epitaxial layer 53 or micro-device 20. Bulk semiconductor layer 51 and epitaxial layer 53 can be or comprise doped or undoped crystalline silicon, for example having N-type dopants such as phosphorus or red phosphorus or P-type dopants such as boron.

Reference is made throughout the present description to examples of micro-transfer printing with stamp 60 when describing certain examples of printing micro-components 30 or micro-device structures 99. Similar other embodiments are expressly contemplated where a transfer device 60 that is not a stamp 60 is used to similarly print micro-components 30 or micro-device structure 99. For example, in some embodiments, a transfer device 60 that is a vacuum-based or electrostatic transfer device 60 can be used to print micro-components 30 or micro-device structure 99. A vacuum-based or electrostatic transfer device 60 can comprise a plurality of transfer posts, each transfer post being constructed and arranged to pick up a single micro-component 30 or micro-device structure 99.

According to some embodiments, micro-transfer printing can include any method of transferring micro-components 30 or micro-device structures 99 from a source substrate (e.g., a micro-component source wafer or semiconductor-on-insulator source wafer 50) to a destination substrate or surface (e.g., insulating layer 10 for micro-components 30 or target substrate 62 for micro-device structure 99) by contacting micro-components 30 or micro-device structure 99 on component source wafer or SOI source wafer 50 with a patterned or unpatterned stamp surface of a transfer device (e.g., stamp 60) to remove micro-components 30 or micro-device structure 99 from the component source wafer or SOI source wafer 50, transferring the transfer device (e.g., stamp 60) and contacted micro-components 30 or micro-device structures 99, and contacting micro-components 30 or micro-device structure 99 to a surface of insulating layer 10 or target substrate 62. Micro-components 30 or micro-device structures 99 can be adhered to transfer device (e.g., stamp 60), insulating layer 10, or target substrate 62 by, for example, van der Waals forces, electrostatic forces, magnetic forces, chemical forces, adhesives, or any combination of the above. In some embodiments, micro-components 30 or micro-device structures 99 are adhered to a stamp 60 with separation-rate-dependent adhesion, for example kinetic control of viscoelastic stamp materials such as can be found in elastomeric transfer devices 60 such as a PDMS stamp 60. Micro-transfer printing is a useful way to micro-assemble micro-device structure 99 because it can print micro-components 30 that are smaller than other prior components using prior assembly methods, such as pick-and-place. Thus, embodiments of the present disclosure enable smaller and spatially denser micro-device structures 99 and micro-systems.

Stamps 60 can be patterned or unpatterned and can comprise stamp posts having a stamp post area on the distal end of the stamp posts. The stamp posts can have a length, a width, or both a length and a width, similar or substantially equal to a length, a width, or both a length and a width of micro-components 30 or micro-device structures 99. In some embodiments, the stamp posts can be smaller than micro-components 30 or micro-device structures 99 or have a dimension, such as a length and/or a width, substantially equal to or smaller than a length or a width of micro-components 30 or micro-device structures 99 in one or two orthogonal directions. In some embodiments, the stamp posts each have a contact surface of substantially identical area.

In exemplary methods, a viscoelastic elastomer (e.g., PDMS) stamp 60 (e.g., comprising a plurality of stamp posts) is constructed and arranged to retrieve and transfer micro-components 30 or micro-device structures 99 from their native micro-component source wafer or SOI source wafer 50 onto non-native insulating layer 10 or target substrate 62. In some embodiments, stamp 60 mounts onto motion-plus-optics machinery (e.g., an opto-mechatronic motion platform) that can precisely control stamp 60 alignment and kinetics with respect to both component source wafers and SOI source wafer 50 and target substrate 62. During micro-transfer printing, the motion platform brings stamp 60 into contact with micro-components 30 or micro-device structures 99, with optical alignment performed before contact. Rapid upward movement of the print-head (or, in some embodiments, downward movement of the component source wafer or SOI source wafer 50) breaks (e.g., fractures) or separates micro-component tether(s) 32 or micro-system tether 56 forming broken (e.g., fractured) or separated tethers, transferring micro-components 30 or micro-device structures 99 to stamp 60. The populated stamp 60 then travels to SOI source wafer 50 (for micro-components 30) or target substrate 62 (for micro-device structures 99) and prints micro-components 30 or micro-device structures 99.

Micro-components 30 disposed in and non-native to micro-device structure 99 can be constructed using integrated circuit, micro-electro-mechanical, or photolithographic methods and can comprise one or more different component materials, for example non-crystalline (e.g., amorphous), polycrystalline, or crystalline semiconductor materials such as silicon or compound semiconductor materials. Similarly, micro-devices 20 constructed in and native to epitaxial layer 53 and SOI source wafer 50 can be constructed using integrated circuit, micro-electro-mechanical, or photolithographic methods and can comprise one or more different component materials, for example non-crystalline (e.g., amorphous), polycrystalline, or crystalline semiconductor materials such as silicon or compound semiconductor materials.

In certain embodiments, micro-devices 20 can be native to and formed on insulating layer 10 over sacrificial portions 54 of SOI source wafers 50 and can include seed layers for constructing crystalline layers on or in SOI source wafers 50. Micro-devices 20, sacrificial portions 54, anchors 58, and micro-system tethers 56 can be constructed, for example using photolithographic processes. Micro-components 30 can each be an unpackaged die transferred from a component source wafer to insulating layer 10. Micro-device structures 99 can be unpackaged dies (each an unpackaged die) transferred directly from native SOI source wafers 50 on or in which micro-device structures 99 are constructed to target substrate 62.

Anchors 58 and micro-system tethers 56 can each be or can comprise portions of SOI source wafer 50 that are not sacrificial portions 54 and can include layers formed on micro-device structure 99, for example dielectric or metal layers and for example layers formed as a part of photolithographic processes used to construct or encapsulate micro-device 20 and micro-components 30.

Target substrate 62 can be any destination substrate or target substrate 62 to which micro-device structures 99 can be transferred (e.g., micro-transfer printed), for example flat-panel display substrates, printed circuit boards, or similar substrates comprising one or more of semiconductor, glass, polymer, quartz, ceramics, metal, and sapphire. Target substrate 62 can be or comprise a semiconductor substrate (for example silicon) or compound semiconductor substrate.

Patterned electrical conductors (e.g., wires, traces, or electrodes (e.g., electrical contact pads) such as those found on printed circuit boards, flat-panel display substrates, and in thin-film circuits) can be formed on any combination of micro-components 30 and micro-devices 20, as well as insulating layer 10, and any one can comprise electrodes 26 (e.g., electrical contact pads 24) that electrically connect to micro-components 30 or micro-devices 20. Such patterned electrical conductors and electrodes 26 (e.g., contact pads 24) can comprise, for example, metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface or provided in micro-channels, or both.

Adhesive 12 can be a curable or cured adhesive 12. Adhesive 12 can be an uncured adhesive 12 that is subsequently cured. Uncured adhesive 12 can be deposited on insulating layer 10 as a liquid, and optionally on micro-device 20 or SOI substrate 50, for example by laminating, coating, inkjet printing, or spraying adhesive 12. Adhesive 12 can be a soft-cured adhesive 12, for example an adhesive 12 from which at least some, a majority, or a substantial majority of solvents or other volatile materials are evaporated or otherwise removed or driven out from uncured adhesive 12 that is still relatively malleable, compliant, or conformable compared to a hard-cured adhesive 12 and can be shaped or otherwise deformed by pressing against the soft-cured adhesive 12, for example with a micro-component 30. An uncured or soft-cured adhesive 12 can be hard cured by, for example, by heating or exposure to electromagnetic radiation that renders adhesive 12 a cured, relatively rigid, non-compliant, non-conformable, and solid adhesive 12 with substantially reduced stickiness or adhesion compared to uncured or soft-cured adhesive 12. Thus, in some embodiments, adhesive 12 can be completely uncured, soft-cured, or hard-cured at various stages of constructing printed micro-device structures 99 of the present disclosure. A layer of soft-cured (e.g., partially cured) adhesive 12 can be patterned, for example by photolithographic processing using masks to expose the layer of uncured adhesive 12 and removing either the exposed or unexposed adhesive 12 to form a patterned layer of soft-cured adhesive 12 on insulating layer 10. According to embodiments of the present disclosure, adhesive 12 can comprise an organic material, a polymer, a resin, or an epoxy. According to some embodiments, adhesive 12 is a photoresist.

Examples of micro-transfer printing processes suitable for disposing micro-components 30 onto insulated layers 10 or micro-device structures 99 onto target substrates 62 are described in Inorganic light-emitting diode displays using micro-transfer printing (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure-Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. patent application Ser. No. 15/373,865, entitled Micro-Transfer Printable LED Component, the disclosure of each of which is incorporated herein by reference in its entirety. Examples of micro-transfer printed acoustic wave filter devices are described in U.S. patent application Ser. No. 15/047,250, entitled Micro-Transfer Printed Acoustic Wave Filter Device, the disclosure of which is incorporated herein by reference in its entirety.

For a discussion of various micro-transfer printing techniques, see also U.S. Pat. Nos. 7,622,367 and 8,506,867, each of which is hereby incorporated by reference in its entirety. Micro-transfer printing using compound micro-assembly structures and methods can also be used in certain embodiments, for example, as described in U.S. patent application Ser. No. 14/822,868, filed Aug. 10, 2015, entitled Compound Micro-Assembly Strategies and Devices, which is hereby also incorporated by reference in its entirety.

Various embodiments of structures and methods were described herein. Structures and methods were variously described as transferring, printing, or micro-transfer printing micro-components 30 and micro-device structures 99. Micro-transfer-printing involves using a transfer device (e.g., an elastomeric stamp 60, such as a PDMS stamp) to transfer a micro-component 30 or micro-device structure 99 using controlled adhesion. For example, an exemplary transfer device 60 can use kinetic or shear-assisted control of adhesion between a transfer device 60 and a micro-component 30 or micro-device structure 99. It is contemplated that, in certain embodiments, where a method is described as including micro-transfer-printing a micro-component 30 or micro-device structure 99, other analogous embodiments exist using a different transfer method. As used herein, transferring a micro-component 30 or micro-device structure 99 can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a vacuum tool or other transfer device is used to transfer a micro-component 30 or micro-device structure 99.

The foregoing disclosure has been described with reference to illustrative embodiments where micro-component(s) 30 are disposed in a single pocket 40 in micro-device 20. Analogous embodiments are contemplated where one or more micro-component(s) 30 are disposed in each of two or more pockets 40 in a single micro-device 20. For example, a red micro-LED 30R, green micro-LED 30G, and blue micro-LED 30B can each be separately disposed in a respective pocket 40 in micro-device 20.

As is understood by those skilled in the art, the terms "over" and "under" are relative terms and can be interchanged in reference to different orientations of the layers, elements, and substrates included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact).

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

Having described certain implementations of embodiments, it will now become apparent to one of skill in the art that other implementations incorporating the concepts of the disclosure may be used. The disclosure has been described in detail with particular reference to certain embodiments thereof, but it will be understood that variations and modifications can be effected within the spirit and scope of the following claims.

PARTS LIST

A cross section line
10 insulating layer
12 adhesive layer/adhesive/layer of adhesive
20 micro-device
21 micro-device surface
22 micro-circuit
24 contact pad
26 electrode
30 micro-component/micro-LED
30R red micro-LED
30G green micro-LED
30B blue micro-LED
32 micro-component tether
34 light
34R red light
34G green light
34B blue light
40 pocket
41 sidewall
42 dielectric material/dielectric structure
50 semiconductor-on-insulator source wafer/SOI source wafer
51 bulk semiconductor layer
52 sacrificial layer
53 epitaxial layer
54 sacrificial portion
56 micro-system tether
58 anchor
60 stamp/transfer device
62 target substrate
99 micro-device structure
100 provide source wafer step
110 form micro-device step
120 etch pocket step
130 print component into pocket step
140 fill pocket step
150 form electrodes step
160 release structure from source wafer step
170 print structure to target substrate step

What is claimed:

1. A micro-device structure, comprising:
   an insulating layer;
   a micro-device disposed on the insulating layer, the micro-device comprising a pocket formed in the micro-device extending from a surface of the micro-device opposite the insulating layer through the micro-device to the insulating layer; and
   a micro-component disposed in the pocket, wherein the micro-component is non-native to the micro-device and is non-native to the insulating layer,
   wherein the micro-component is electrically connected to the micro-device.

2. The micro-device structure of claim 1, wherein the micro-device comprises a micro-device substrate, the micro-component comprises a micro-component substrate, and the micro-device substrate is distinct from the micro-component substrate.

3. The micro-device structure of claim 2, wherein the micro-device substrate comprises a different material from the micro-component substrate.

4. The micro-device structure of claim 1, wherein the insulating layer is transparent to visible light, infrared light, or ultraviolet light.

5. The micro-device structure of claim 4, wherein the insulating layer comprises an oxide or a nitride.

6. The micro-device structure of claim 1, wherein the micro-device is a semiconductor-on-insulator device.

7. The micro-device structure of claim 1, wherein the insulating layer is differentially etchable from the micro-device.

8. The micro-device structure of claim 1, wherein the micro-component is an inorganic LED.

9. The micro-device structure of claim 8, wherein the inorganic LED is disposed on the insulating layer to emit light through the insulating layer.

10. The micro-device structure of claim 1, wherein the micro-component is controllable by the micro-device.

11. The micro-device structure of claim 1, wherein the micro-device has at least one of: a length no greater than 1 mm, a width no greater than 200 µm, and a thickness no greater than 100 µm.

12. The micro-device structure of claim 1, wherein the micro-component has at least one of: a length no greater than 50 µm, a width no greater than 50 µm, and a thickness no greater than 20 µm.

13. The micro-device structure of claim 1, wherein the micro-component has a thickness no more than 30% greater than a thickness of the micro-device.

14. The micro-device structure of claim 1, comprising a plurality of micro-components disposed in the pocket that are each non-native to the micro-device.

15. The micro-device structure of claim 14, wherein the plurality of micro-components disposed in the pocket comprises (i) one or more red micro-LEDs operable to emit red light disposed in the pocket, (ii) one or more green micro-LEDs operable to emit green light disposed in the pocket, (iii) one or more blue micro-LED operable to emit blue light disposed in the pocket, or (iv) any combination of (i), (ii), and (iii).

16. The micro-device structure of claim 15, wherein the micro-device comprises a pixel controller electrically connected to the plurality of micro-components and the plurality of micro-components comprises a red micro-LED, a green micro-LED, and a blue micro-LED and wherein the pixel controller, the red micro-LED, the green micro-LED, and the blue micro-LED are comprised in a pixel.

17. The micro-device structure of claim 1, wherein the micro-device completely surrounds the micro-component in a plane parallel to a surface of the insulating layer.

18. The micro-device structure of claim 1, wherein the micro-device does not completely surround the micro-component in a plane parallel to a surface of the insulating layer.

19. The micro-device structure of claim 18, wherein the micro-device forms at least one side of the pocket.

20. The micro-device structure of claim 1, wherein the micro-device comprises a side-wall forming a side of the pocket and wherein the micro-component is in contact with or adhered to the side-wall.

21. A micro-device structure, comprising:
   an insulating layer;
   a micro-device disposed on the insulating layer, the micro-device comprising a pocket formed in the micro-device extending from a surface of the micro-device opposite the insulating layer through the micro-device to the insulating layer; and
   a micro-component disposed in the pocket, wherein the micro-component is non-native to the micro-device and is non-native to the insulating layer,
   wherein the insulating layer is differentially etchable from the micro-device.

22. A micro-device structure, comprising:
   an insulating layer;

a micro-device disposed on the insulating layer, the micro-device comprising a pocket formed in the micro-device extending from a surface of the micro-device opposite the insulating layer through the micro-device to the insulating layer;

a micro-component disposed in the pocket, wherein the micro-component is non-native to the micro-device and is non-native to the insulating layer; and a plurality of micro-components disposed in the pocket that are each non-native to the micro-device, wherein the plurality of micro-components disposed in the pocket comprises (i) one or more red micro-LEDs operable to emit red light disposed in the pocket, (ii) one or more green micro-LEDs operable to emit green light disposed in the pocket, (iii) one or more blue micro-LED operable to emit blue light disposed in the pocket, or (iv) any combination of (i), (ii), and (iii), and wherein the micro-device comprises a pixel controller electrically connected to the plurality of micro-components and the plurality of micro-components comprises a red micro-LED, a green micro-LED, and a blue micro-LED and wherein the pixel controller, the red micro-LED, the green micro-LED, and the blue micro-LED are comprised in a pixel.

23. A micro-device structure, comprising:

an insulating layer;

a micro-device disposed on the insulating layer, the micro-device comprising a pocket formed in the micro-device extending from a surface of the micro-device opposite the insulating layer through the micro-device to the insulating layer; and a micro-component disposed in the pocket, wherein the micro-component is non-native to the micro-device and is non-native to the insulating layer, wherein the micro-device completely surrounds the micro-component in a plane parallel to a surface of the insulating layer.

24. A micro-device structure, comprising:

an insulating layer;

a micro-device disposed on the insulating layer, the micro-device comprising a pocket formed in the micro-device extending from a surface of the micro-device opposite the insulating layer through the micro-device to the insulating layer; and a micro-component disposed in the pocket, wherein the micro-component is non-native to the micro-device and is non-native to the insulating layer, wherein the micro-device does not completely surround the micro-component in a plane parallel to a surface of the insulating layer, and wherein the micro-device forms at least one side of the pocket.

25. A micro-device structure, comprising:

an insulating layer;

a micro-device disposed on the insulating layer, the micro-device comprising a pocket formed in the micro-device extending from a surface of the micro-device opposite the insulating layer through the micro-device to the insulating layer; and a micro-component disposed in the pocket, wherein the micro-component is non-native to the micro-device and is non-native to the insulating layer, wherein the micro-device comprises a side-wall forming a side of the pocket and wherein the micro-component is in contact with or adhered to the side-wall.

* * * * *